(12) United States Patent
Kuszaj

(10) Patent No.: US 8,578,599 B2
(45) Date of Patent: Nov. 12, 2013

(54) METHOD OF MAKING A SUPPORTED FOAM CIRCUIT LAMINATE

(75) Inventor: Michael S. Kuszaj, Brooklyn, CT (US)

(73) Assignee: Rogers Corporation, Rogers, CT (US)

( * ) Notice: Subject to any disclaimer, the term of this patent is extended or adjusted under 35 U.S.C. 154(b) by 143 days.

(21) Appl. No.: 13/053,417

(22) Filed: Mar. 22, 2011

(65) Prior Publication Data

US 2011/0229709 A1    Sep. 22, 2011

Related U.S. Application Data

(60) Provisional application No. 61/316,093, filed on Mar. 22, 2010.

(51) Int. Cl.
*H05K 3/02* (2006.01)
(52) U.S. Cl.
USPC .................. 29/846; 29/825; 29/830; 29/832
(58) Field of Classification Search
USPC ............................................ 29/825, 830, 832
See application file for complete search history.

(56) References Cited

U.S. PATENT DOCUMENTS

| 3,821,490 A * | 6/1974 | Bobb ............................. 381/182 |
| 4,122,302 A * | 10/1978 | Bobb ............................. 381/335 |
| 4,937,585 A | 6/1990 | Shoemaker |
| 5,541,366 A | 7/1996 | Maoz et al. |
| 5,733,639 A | 3/1998 | Gosselin |
| 6,746,946 B2 | 6/2004 | Berg |
| 6,885,342 B2 * | 4/2005 | Saegrov et al. ........ 343/700 MS |
| 7,471,248 B2 * | 12/2008 | Popugaev et al. ...... 343/700 MS |
| 2003/0117329 A1 * | 6/2003 | Saegrov et al. ............... 343/741 |

* cited by examiner

*Primary Examiner* — Carl Arbes
(74) *Attorney, Agent, or Firm* — Cantor Colburn LLP

(57) ABSTRACT

A method of making a supported foam circuit laminate comprises fitting a dielectric foam substrate having a shape defined by edges to a support frame having a thickness, an inner rim and an outer rim, wherein the edges of the dielectric foam substrate are flush with the inner rim of the support frame, and the dielectric foam substrate has a thickness that is greater than the thickness of the support frame; disposing an electrically conductive layer onto a side of the dielectric foam substrate and the support frame, wherein the edges of the electrically conductive layer overlap the inner rim of the support frame; and co-laminating the electrically conductive layer to the dielectric foam substrate and the overlapped support frame under heat and pressure to provide a supported foam circuit laminate.

15 Claims, 1 Drawing Sheet

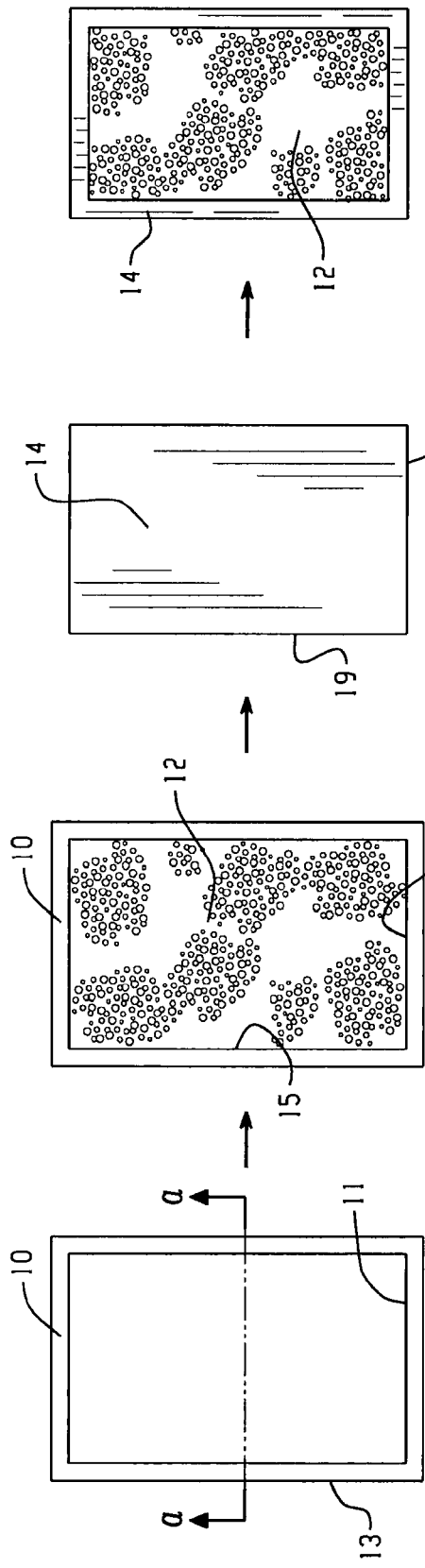
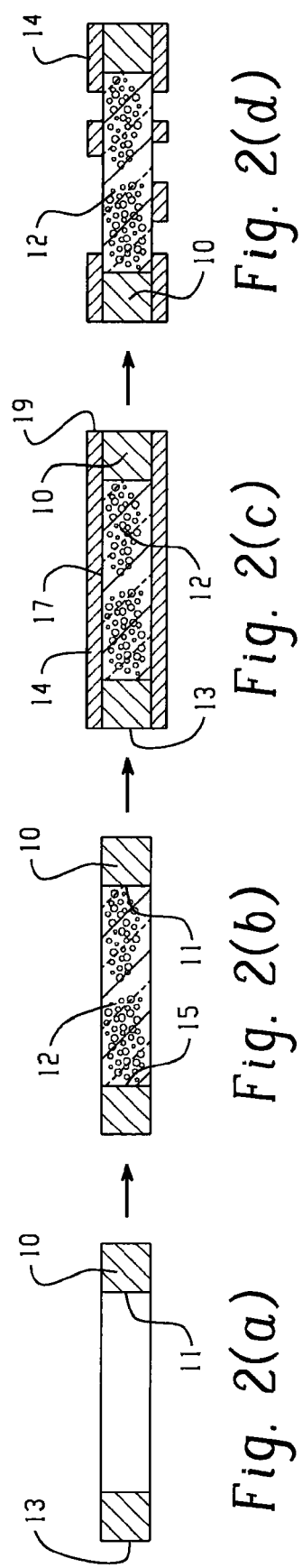

METHOD OF MAKING A SUPPORTED FOAM CIRCUIT LAMINATE

CROSS-REFERENCE TO RELATED APPLICATION

This application claims the benefit of U.S. Provisional Application Ser. No. 61/316,093 filed Mar. 22, 2010, which is incorporated herein by reference.

BACKGROUND

This disclosure relates to methods for the manufacture of circuit laminates, and circuit boards containing such laminates.

Printed circuit boards having low dielectric constants and low dissipation factors are preferred for use with high frequency circuits. Printed circuit boards are typically manufactured from circuit laminates having a conductive layer, e.g., copper, fixedly attached to a dielectric substrate layer. Double clad circuit laminates have two conductive layers, one on each side of the dielectric substrate layer. Patterning a conductive layer of a laminate, for example by etching, provides a circuit. Multilayer circuits comprise a plurality of conductive layers, at least one of which contains a conductive wiring pattern.

For certain high frequency applications, foamed materials can be used as the dielectric substrate layer to provide the desirable dielectric and dissipation properties. Foamed circuit laminates are known, being described for example in U.S. Pat. No. 4,937,585 to Shoemaker et al. and U.S. Pat. No. 5,541,366 to Moaz et al.

The cellular structure of foams provide unique properties to dielectric substrates, but also give rise to processing difficulties, particularly when processed using conventional circuit board procedures and equipment. Use of open-celled foams is particularly problematic. For example, the foamed material can be subject to too much compression during lamination to form multi-layer circuit assemblies, which adversely affects the desired electrical properties of the multi-layered circuits. The foams are easily damaged by tooling holes and racks. Another processing problem associated with foamed dielectric substrates is the occurrence of wrinkling during lamination, which occurs as the foam material shrinks during cool down. This currently creates the need for a cumbersome pre-lamination stress relief process. It has further been found that foamed dielectric substrates can be susceptible to absorption of processing chemicals at the surface, edges, and through-hole walls of the foamed material.

There accordingly remains a need in the art for processes and materials for the manufacture of circuit laminates containing foamed dielectric substrates that are compatible with standard processing procedures and equipment.

BRIEF SUMMARY

The above-described and other needs are met by a method of making a supported foam circuit laminate, comprising fitting a dielectric foam substrate having a shape defined by edges to a support frame having a thickness, an inner rim and an outer rim, wherein the edges of the dielectric foam substrate are flush with the inner rim of the support frame, and the dielectric foam substrate has a thickness that is greater than the thickness of the support frame; disposing an electrically conductive layer onto a side of the dielectric foam substrate and the support frame, wherein the edges of the electrically conductive layer overlap the inner rim of the support frame; and co-laminating the electrically conductive layer to the dielectric foam substrate and to the overlapped support frame under heat and pressure to provide a supported foam circuit laminate.

Supported foam circuit laminates are also described. In one embodiment, a supported foam circuit laminate comprises a support frame having a first surface, an opposite second surface, an inner rim defining a void, and an outer rim, a dielectric foam substrate having a first side and an outer second side and a shape defined by edges, wherein the edges of the dielectric foam substrate are fitted within and in continuous contact with the inner rim of the support frame; and an electrically conductive layer having a shape defined by edges, and laminated onto the first surface of the dielectric foam substrate and the support frame, wherein the edges of the electrically conductive layer overlap the inner rim of the support frame.

The above described and other features are exemplified by the following figures and detailed description.

BRIEF DESCRIPTION OF THE DRAWINGS

The components in the drawings are not necessarily to scale, emphasis instead being placed upon clearly illustrating the principles of the embodiments described herein. Moreover, in the drawings, like reference numerals designate corresponding parts throughout the several views.

FIG. 1(a)-1(d) is process flow diagram showing a top view of an embodiment of a method of making a foam dielectric laminate assembly.

FIG. 2(a)-2(d) is process flow diagram showing a cross-sectional view of the embodiment of a method of making a foam dielectric laminate assembly shown in FIG. 1 along lines a-a' in FIG. 1.

DETAILED DESCRIPTION

The inventors hereof have found that by using a support frame co-laminated with a dielectric foam substrate inserted therein, a foam dielectric laminate assembly can be produced with reduced foam compression, less laminate wrinkling, and improved compatibility with conventional circuit processing techniques, particularly for plated through-hole components. The support frame advantageously protects the dielectric foam substrate throughout circuit processing, and is not removed from the laminate assembly until the processing is complete. The support frame therefore keeps the dielectric foam substrate rigid during processing and protects the edges of the foam from exposure to the processing liquids.

Accordingly, a method of making a dielectric foam circuit laminate comprises fitting a dielectric foam substrate into a support frame, and disposing an electrically conductive layer onto the dielectric foam substrate and support frame such that the electrically conductive layer at least partially overlaps the support frame. The electrically conductive layer is then co-laminated to the dielectric foam substrate and the overlapped portion of the support frame. The resulting foam laminate can then be processed using standard techniques and procedures to produce a circuit and a multilayer circuit. After the desired product is obtained, the support frame may be excised from the product.

FIGS. 1 and 2 graphically illustrates an exemplary embodiment of a method of manufacture of a dielectric foam circuit laminate, wherein FIG. 1 is a top view, and FIG. 2 is a cross-sectional view through line a-a' of FIG. 1.

Support frame 10 as shown in FIGS. 1a and 2a serves to provide rigid support and protection to the dielectric foam substrate throughout processing. The support frame 10 can be formed by a variety of methods, e.g., by cutting or molding. The material used in the support frame is selected to have a stiffness capable of providing the support and protection to the dielectric foam substrate, to be inert to the dielectric foam material, and inert under conditions (including chemical exposure) used for circuit processing. Suitable materials are thus stable over the range of processing temperatures and pressures used during lamination and subsequent circuitizing steps. The materials are further inert to solvents, aqueous acids, and aqueous bases used in circuit processing. Exemplary materials having these properties include metals, certain thermoplastic or thermoset polymeric materials, and polymer composites. Reinforced polymer composites can also be used, for example, a thermoplastic or thermoset polymeric material reinforced with glass fibers (random or woven), carbon fibers, and the like. In one embodiment, the support frame can be formed from a glass reinforced polybutadiene/ceramic laminate, such as RO4000® laminate material available from Rogers Corporation.

The support frame is formed into a shape that frames the dielectric foam substrate and provides rigid support and protection from damage during conventional circuit processing techniques. In general, the interior rim 11 of the frame will have a configuration that corresponds to the configuration of the dielectric foam substrate, in order to provide adequate support and protection to the substrate. The outer rim 13 of the support frame can have a configuration corresponding to the configuration of the inner rim 11 (e.g., a rectangular inner rim configuration 11 with a rectangular outer rim configuration 13 of larger area), or have a different configuration, for example to facilitate storage or handling. In one embodiment, wherein the dielectric foam substrate has a rectangular configuration, the support frame has a corresponding rectangular picture frame configuration that surrounds the foam material.

As shown in FIGS. 1b and 2b, the dielectric foam substrate 12 is fit to the inner rim 11 of support frame 10, and inserted into the inner rim 11 such that the edges 15 of the dielectric foam substrate are surrounded and sealed by the inner support frame. Use of a unitary support frame, rather than a shim, aids in eliminating one avenue of liquid absorption that can occur during the conventional circuit processing techniques.

The dielectric foam material used as the substrate can have an open-cell or closed-cell structure. In an exemplary embodiment, the dielectric foam substrate is an open-cell foam. The cellular structure of the foam advantageously reduces the dielectric constant ($E_r$), loss (tan $\delta$), and weight in comparison to other dielectric laminate substrates.

The dielectric foam substrate can be formed from a variety of polymeric materials having low dielectric constants and dissipation factor that are adaptable to circuit board chemistries for printed circuit board applications. Foam materials that can be formulated to provide the desired electrical and physical properties include polyolefins, fluoropolymers, polyimides, polyarylketones, polyarylether ketones, silicones, polyurethanes, and the like. The polymeric foam materials may be a thermoplastic (provided that it is capable of withstanding processing and use temperatures) or thermoset.

The unlaminated dielectric foam substrate has a thickness effective to produce a circuit or circuit laminate of the desired thickness. In an advantageous embodiment the unlaminated dielectric foam substrate has that is about 0.025 to about 0.175 millimeters (mm) (about 1 to about 7 mils), specifically 0.075 to 0.127 mm (3 to 5 mils) thicker than the support frame. Having a dielectric foam substrate thicker than the support frame permits the electrically conductive layer to securely adhere to the dielectric foam substrate by permitting a small amount of compression (i.e., the thickness difference between the support frame and the dielectric foam substrate) during lamination.

An electrically conductive layer 14 is arranged on a surface 17 of the dielectric foam substrate 12 and the support frame 10 to provide a supported single clad foam circuit laminate (single clad not shown). In a specific embodiment, two conductive layers 14 and 16 are arranged on opposite sides of the dielectric foam substrate 12 to provide a double clad foam circuit laminate as shown in FIGS. 1c and 2c. The electrically conductive layer(s) 14, 16 provide an electrically conductive surface for establishing conductive paths for interconnecting electrical components to the foam circuit laminate. Useful conductive materials include conductive metal foils, for example stainless steel, silver, copper, or aluminum.

There are no particular limitations regarding the thickness of the conductive layer, nor are there any limitations as to the shape, size, or texture of the surface of the conductive layer. In an embodiment, however, the conductive layer has a thickness of about 3 micrometers to about 200 micrometers, with about 9 micrometers to about 180 micrometers especially useful. When two or more conductive layers are present, the thickness of the two layers can be the same or different.

Copper conductive layers are especially useful. The copper foil can be made either by electrodeposition (ED) on a rotating stainless steel drum from a copper sulfate bath, or by the rolling of solid copper bars. The copper conductive layer can be treated to increase surface area, treated with a stabilizer, for example, through stainproofing, to prevent oxidation of the conductive layer, or treated to form a thermal barrier. Both low and high roughness copper conductive layers treated with zinc or zinc alloy thermal barriers are particularly useful and can further optionally comprise a stain-proofing layer. Suitable copper conductive layers (foils) are commercially available from, for example, Circuit Foil under the trade name TWS, from Oak-Mitsui under the tradename MLS-TOC-500, SQ-VLP, and MQ-VLP, and from Furukawa Circuit Foils under the tradename F2-WS and FWL-WS.

Conductive layer 14 (and 16 if present) is sized so as to overlap and extend beyond edge 15 of the dielectric foam substrate layer 15 and the inner rim 11 of the support frame 10. In an embodiment, the edges 19 of conductive layer 14 are coterminal with the outer rim 13 of support frame 10. In a specific embodiment, the edges of each of the conductive layers 14 and 16 are coterminal with the outer rim 13 of the support frame.

An adhesive layer (not shown) can be disposed between the dielectric foam substrate 12 and the electrically conductive layer 14 to form the supported foam laminate. The adhesive can be disposed onto the dielectric foam substrate surface 12 and on the surface of the frame, or, alternatively, the electrically conductive layer 14 can be pre-coated with adhesive. Application of the adhesive to either layer can be by means known in the art, for example roll coating, spraying, or placing an adhesive film.

The adhesive preferably has a low dielectric constant and a low dissipation factor in the operative frequency range and provides a bond between the metal of the electrically conductive layer and the dielectric foam substrate that is capable of withstanding the subsequent circuit processing techniques, as well as the future printed circuit board applications. The adhesive used in attaching an electrically conductive layer to the dielectric foam substrate is of importance since an adhesive having unsuitable electrical properties will adversely affect the properties of the resulting laminate assembly. Useful adhesives include thermoplastic or thermoset polymeric materials. The adhesive layer may be a free film or adhesively coated on the conductive foil layer. If the adhesive layer is too thick, it can impact the conductive properties of the laminate Suitable adhesive layers accordingly have a thickness of about 0.001 to less than or equal to about 0.1 millimeters (mm) (about 0.04 to about 4 mils). An exemplary adhesive-coated copper foil is made by Rogers Corporation under the trade name LoPro™ adhesive-coated copper foil. By using an electrically conductive layer pre-coated with adhesive, the step of disposing an adhesive layer on the dielectric foam substrate can be eliminated, thereby increasing process efficiency and reducing cost.

The dielectric foam substrate, support, and electrically conductive layer are then co-laminated (i.e., then pressed together, typically while heating), to attach the conductive layer to the substrate and to the overlapped portion of the support. "Co-laminated" as used herein means that the lamination of the electrically conductive layer to the dielectric foam substrate and the overlapped portion of the support occur in the same operation. It is preferred, although not necessary, that the co-lamination be carried out simultaneously. Sufficient pressure is applied to maintain good contact between the surfaces being bonded during the heating cycle. Lamination is typically carried out in a flat bed press, which allows for simultaneous co-lamination. The temperature in the flat bed press is maintained long enough for the adhesive (if present) to wet the bonding surfaces of the electrically conductive layer and the dielectric foam substrate. Specific time and temperature cycles will depend on the particular support, dielectric foam, conductive layer, and adhesive used, and can be readily determined by one of ordinary skill in the art without undue experimentation.

Use of the support frame during lamination prevents, wholly or partially, post-lamination wrinkling. The support frame reduces the occurrence of wrinkles in the electrically conductive layer by improving the dimensional stability of the foam material used for the substrate. The support frame provides support around the entire perimeter of the dielectric foam substrate. This complete planar support improves the dimensional stability of the foam and, therefore, decreases the shrinkage, and likewise, the occurrence of wrinkling. The support frame, therefore, can eliminate the requirement of a pre-lamination stress relief step in the fabrication process.

After lamination, the single clad or double clad supported foam circuit laminate can be further processed to provide single layer or multi-layer circuit boards. For example, once the electrically conductive layer has been laminated to the dielectric foam substrate, an image of the desired circuit can be imprinted onto the conductive layer surface. The imprinted electrically conductive layer can then be etched to remove the undesired conductor and leave behind the desired printed circuit board, as shown in FIGS. 1(d) and 2(d). A wide variety of etching processes are known, and the etching process is selected so as to be compatible with the dielectric foam substrate material and the support frame. While the conventional circuit processing techniques are being performed, the support frame seals two avenues of chemical absorption. The adhesive-coated conductive layer seals the dielectric foam substrate surface. Likewise, because the assembly was laminated with the support frame in place, the electrically conductive layer bridges the dielectric foam substrate and the support frame, thereby sealing the foam's edges from the process chemicals. Moreover, the support frame is able to support tooling holes and protect edge damage, therefore advantageously permitting the making of plated through-holes in the dielectric foam substrate using conventional circuit processing techniques.

The resulting board can then be populated with active and passive components. Further processing allows boards with different circuit designs and different dielectric substances to be stacked, aligned, and bonded together with non-conductive, thermoset, and/or pressure sensitive adhesives to form a multilayer board. The support frame further eliminates additional compression of the dielectric foam substrate, which conventionally occurs during multilayer board bonding.

After the conventional circuit processing is complete, the resultant foam dielectric laminate assembly (i.e., the foam circuit board) may be excised from the support frame, for example by cutting. Any of a large number of sharp-edged devices may be used to excise the part from the frame, including, but not limited to, razor blades, wallboard, knives, and Exacto® knives. The foam dielectric assembly may also be excised with laser cutting tools, mechanical cutting tools including routers, steel rule dies, and the like.

Use of the supported foam circuit laminate in the manufacture of circuit materials and circuits provides significant advantages. The circuit materials and circuits can be formed with reduced foam compression. The supporting frame helps eliminate laminate wrinkling. The supporting frame also significantly improves the dimensional stability during etching, so there is no need for a stress relief step during manufacture.

The circuit laminates further have improved compatibility with conventional circuit processing techniques, for example the manufacture of plated through-holes since there is less absorption of processing chemicals at the surface and edge of the foam substrate.

Moreover, unlike the shims, the support frame keeps the dielectric foam substrate rigid during processing, protects the edges of the foam from exposure to processing liquids, and reduces the occurrence of wrinkling by minimizing the amount of foam shrinkage that occurs after lamination.

Ranges disclosed herein are inclusive of the endpoints and all intermediate values, and independently combinable. Furthermore, the terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "about" used in connection with a quantity is inclusive of the state value and has the meaning dictated by context, (e.g., includes the degree of error associated with measurement of the particular quantity). Reference throughout the specification to "another embodiment", "an embodiment", and so forth, means that a particular element (e.g., feature, structure, and/or characteristic) described in connection with the embodiment is included in at least one embodiment described herein, and can or can not be present in other embodiments. In addition, it is to be understood that the described elements can be combined in any suitable manner in the various embodiments. As used herein, the terms sheet, film, plate, and layer, are used interchangeably, and are not intended to denote size. Further as used herein, a dissolution medium is inclusive of a dissolution medium. All references are incorporated herein by reference in their entirety.

While the invention has been described with reference to several embodiments thereof, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A method of making a supported foam circuit laminate, comprising:
   fitting a dielectric foam substrate having a shape defined by edges to a support frame having a thickness, an inner rim and an outer rim, wherein
   the edges of the dielectric foam substrate are flush with the inner rim of the support frame, and
   the dielectric foam substrate has a thickness that is greater than the thickness of the support frame;
   disposing an electrically conductive layer onto a side of the dielectric foam substrate and the support frame, wherein the edges of the electrically conductive layer overlap the inner rim of the support frame;
   co-laminating the electrically conductive layer to the dielectric foam substrate and the overlapped frame under heat and pressure to provide a supported foam circuit laminate; and
   forming a circuit in the electrically conductive layer.

2. The method of claim 1, further comprising disposing an adhesive layer between the surface of the dielectric foam substrate and the electrically conductive layer.

3. The method of claim 2, wherein the adhesive layer has a thickness of less than or equal to about 0.1 millimeters.

4. The method of claim 1, further comprising pre-coating the electrically conductive layer with an adhesive prior to disposing the electrically conductive layer onto the dielectric foam substrate and the support frame.

5. The method of claim 1, further comprising disposing a second conductive layer onto a side of the dielectric foam substrate and the support frame on a side opposite the first layer, wherein the edges of the second electrically conductive layer overlap the inner rim of the support frame.

6. The method of claim 5, further comprising disposing an adhesive layer between the surface of the dielectric foam substrate and the second electrically conductive layer.

7. The method of claim 6, wherein the adhesive layer has a thickness of less than or equal to about 0.1 millimeters.

8. The method of claim 5, further comprising pre-coating the electrically conductive layer with an adhesive prior to disposing the electrically conductive layer onto the dielectric foam substrate and the support frame.

9. The method of claim 1, wherein forming the circuit comprises etching the electrically conductive layer.

10. The method of claim 1, further comprising excising the foam circuit from the support frame.

11. The method of claim 1, further comprising forming plated through-holes in the supported foam circuit laminate.

12. The method of claim 1, wherein the dielectric foam substrate is about 0.025 to about 0.175 millimeters thicker than the support frame.

13. The method of claim 1, wherein the dielectric foam substrate comprises an open cell foam material.

14. The method of claim 1, wherein the support frame is formed from a copper sheet.

15. A method of making a supported foam circuit laminate, comprising:
   fitting a dielectric foam substrate having a shape defined by edges to a support frame having a thickness, an inner rim and an outer rim, wherein
   the edges of the dielectric foam substrate are flush with the inner rim of the support frame, and
   the dielectric foam substrate is about 0.025 to about 0.175 millimeters thicker than the support frame;
   disposing an electrically conductive layer onto a side of the dielectric foam substrate and the support frame, wherein the edges of the electrically conductive layer overlap the inner rim of the support frame; and
   co-laminating the electrically conductive layer to the dielectric foam substrate and the overlapped frame under heat and pressure to provide a supported foam circuit laminate.

* * * * *